(12) United States Patent
Danilov et al.

(10) Patent No.: US 10,579,490 B2
(45) Date of Patent: Mar. 3, 2020

(54) FAST GEO RECOVERY METHOD FOR ELASTIC CLOUD STORAGE

(71) Applicant: EMC IP Holding Company LLC, Hopkinton, MA (US)

(72) Inventors: Mikhail Danilov, Saint Petersburg (RU); Konstantin Buinov, Kirovsk (RU); Sergey Karpenkov, Saint Petersburg (RU); Maxim S. Trusov, Saint Petersburg (RU); Kirill Zakharov, Saint Petersburg (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 129 days.

(21) Appl. No.: 15/636,470

(22) Filed: Jun. 28, 2017

(65) Prior Publication Data

US 2018/0181475 A1     Jun. 28, 2018

(30) Foreign Application Priority Data

Dec. 23, 2016   (RU) ................. 2016150867

(51) Int. Cl.
| | |
|---|---|
| G06F 11/00 | (2006.01) |
| G06F 11/20 | (2006.01) |
| H03M 13/15 | (2006.01) |
| G06F 11/10 | (2006.01) |
| H04L 29/08 | (2006.01) |

(Continued)

(52) U.S. Cl.
CPC ...... *G06F 11/2069* (2013.01); *G06F 11/1076* (2013.01); *G06F 11/1088* (2013.01); *G06F 11/1402* (2013.01); *H03M 13/154* (2013.01); *H03M 13/373* (2013.01); *H03M 13/3761* (2013.01); *H04L 67/1095* (2013.01); *H04L 67/1097* (2013.01); *G06F 2201/805* (2013.01); *G06F 2201/82* (2013.01)

(58) Field of Classification Search
CPC .......... G06F 11/1076; G06F 11/2069; H03M 13/154; H03M 13/373; H03M 13/3761; H04L 67/1095; H04L 67/1097
See application file for complete search history.

(56) References Cited

U.S. PATENT DOCUMENTS

| | | | |
|---|---|---|---|
| 8,171,379 B2 * | 5/2012 | Adarshappanavar | G06F 11/1076 714/770 |
| 8,856,619 B1 * | 10/2014 | Cypher | G06F 11/1044 714/6.2 |
| 9,098,447 B1 * | 8/2015 | Donlan | H03M 13/15 |

(Continued)

*Primary Examiner* — Marc Duncan
(74) *Attorney, Agent, or Firm* — Womble Bond Dickinson (US) LLP

(57) ABSTRACT

One embodiment is related to a method for remote replication recovery, comprising: determining that a damaged data chunk at a first zone of a cloud storage system is not recoverable locally; determining one or more data fragments of the damaged data chunk that are to be recovered with remote replication recovery based on data stored at a second zone and at a third zone of the cloud storage system, wherein the damaged data chunk comprises a plurality of data fragments; recovering the one or more data fragments of the damaged data chunk with remote replication recovery based on the data stored at the second zone and at the third zone of the cloud storage system; and repairing the damaged data chunk with the recovered data fragments at the first zone.

24 Claims, 7 Drawing Sheets

(51) Int. Cl.
*H03M 13/37* (2006.01)
*G06F 11/14* (2006.01)

(56) References Cited

U.S. PATENT DOCUMENTS

| | | | |
|---|---|---|---|
| 9,665,428 B2* | 5/2017 | Vairavanathan | G06F 11/1076 |
| 9,817,715 B2* | 11/2017 | Slik | G06F 11/1076 |
| 10,013,306 B2* | 7/2018 | Umbehocker | G06F 11/1469 |
| 10,152,377 B2* | 12/2018 | Sangamkar | G06F 11/1076 |
| 2013/0275695 A1* | 10/2013 | Ponsford | G06F 11/1448 |
| | | | 711/162 |
| 2014/0380126 A1* | 12/2014 | Yekhanin | G06F 11/10 |
| | | | 714/766 |
| 2016/0380650 A1* | 12/2016 | Calder | G06F 11/1076 |
| | | | 714/766 |
| 2017/0097875 A1* | 4/2017 | Jess | G06F 11/2069 |

\* cited by examiner

FAST GEO RECOVERY METHOD FOR ELASTIC CLOUD STORAGE

CROSS-REFERENCE TO RELATED APPLICATIONS

This application claims priority to Russian Patent Application No. 2016150867, filed Dec. 23, 2016, which is incorporated herein by reference in its entirety.

FIELD OF THE INVENTION

Embodiments of the disclosure are related to data storage, and more particularly, to a method, apparatus, and system for data recovery in a geo-replication cloud setup.

BACKGROUND

Cloud-based data storage solutions are becoming increasingly popular. One example is the Elastic Cloud Storage (ECS) service provided by Dell EMC. Latest trends in software architecture and development are used in these solutions to achieve outstanding scalability, availability, and serviceability.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure relate to lightweight and fast data recovery in a geographically distributed environment.

Cloud-based data storage solutions are becoming increasingly popular. In a cloud-based data storage system, data may be protected with an erasure coding approach. However, erasure coding does not protect against site failures or outages. An additional level of data redundancy may be provided with geo-replication. In short, geo-replication provides enhanced protection against site failures by having multiple copies of the data, i.e., a primary copy of the data at the original site and one or more secondary copies of the data at one or more remote sites. The sites may be geographically distributed, e.g., on different continents, and may also be referred to as zones hereinafter. Further, the XOR (exclusive or) technique may be used with geo-replication. The existing data protection implementation suffers from high data recovery cost in case of hardware failures and/or data corruption.

An erasure code is a forward error correction code for the binary erasure channel. Erasure coding has also been adapted for use as a data protection/recovery technique within data storage systems.

Figure 1:
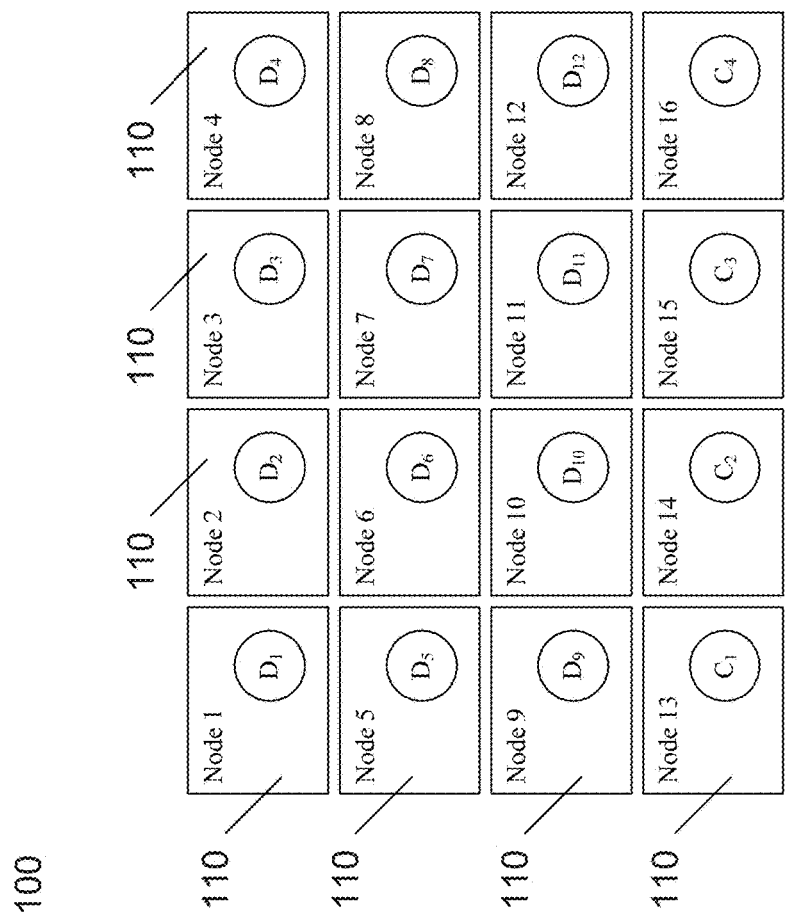
FIG. 1 is a diagram illustrating an example implementation of erasure coding in a data storage system.

Referring to FIG. 1, a diagram 100 illustrating an example implementation of erasure coding in a data storage system is shown. A data block (D) to be protected may be divided into k fragments. During encoding m redundant coding fragments may be created. Therefore, a total of k+m fragments may be stored. The known method of erasure coding ensures that the system can tolerate the loss of any m fragments in the k+m fragments stored. In other words, the missing or corrupt fragments can be recovered based on the remaining fragments as long as no more than m fragments are invalid. In one embodiment, the coding scheme may be 12+4, i.e. k equals to 12 and m equals to 4. In the example shown in FIG. 1, there are 16 nodes 110 (i.e., Node 1, Node 2 . . . Node 16) and 16 fragments (D1, D2 . . . D12, C1, C2, C3, and C4) to be stored. Each node may store just one fragment. In other embodiments (not shown), one node may contain several fragments. When some fragments are missing, the missing fragments may be restored via a decoding operation.

In one embodiment, all disk space may be partitioned into a set of blocks of a fixed size called chunks. The chunk size may be 128 Megabytes (MBs). All user data may be stored in these chunks and the chunks may be shared. One chunk may contain segments of several user objects.

Figure 2:
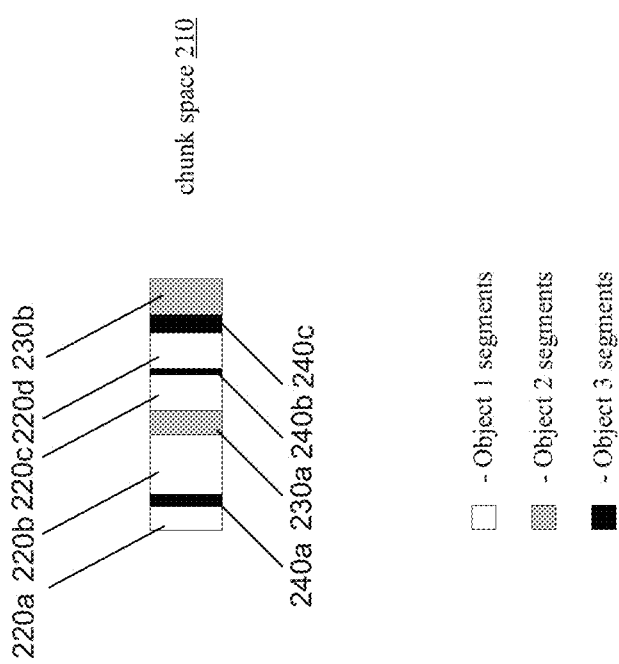
FIG. 2 is a diagram illustrating an example data chunk in a data storage system.

Referring to FIG. 2, a diagram 200 illustrating an example data chunk in a data storage system is shown. A chunk 210 may contain mixed segments of several user objects. As shown in FIG. 2, the chunk 210 may contain segments 220a, 220b, 220c, 220d that belong to Object 1, segments 230a, 230b that belong to Object 2, and segments 240a, 240b, 240c that belong to Object 3. A user data object may be stored as a set of segments that reside in several chunks. Chunk content may be modified in an append-only mode. When a chunk becomes full enough, it gets sealed. Content of sealed chunks is immutable.

Geo-replication provides enhanced protection against site failures by having multiple copies of the data, i.e., a primary copy of the data at the original site and one or more secondary copies of the data at one or more remote sites. The sites may be geographically distributed, e.g., on different continents, and may also be referred to as zones hereinafter. An XOR technique may be used to minimize capacity overhead associated with additional copies of data.

Figure 3:
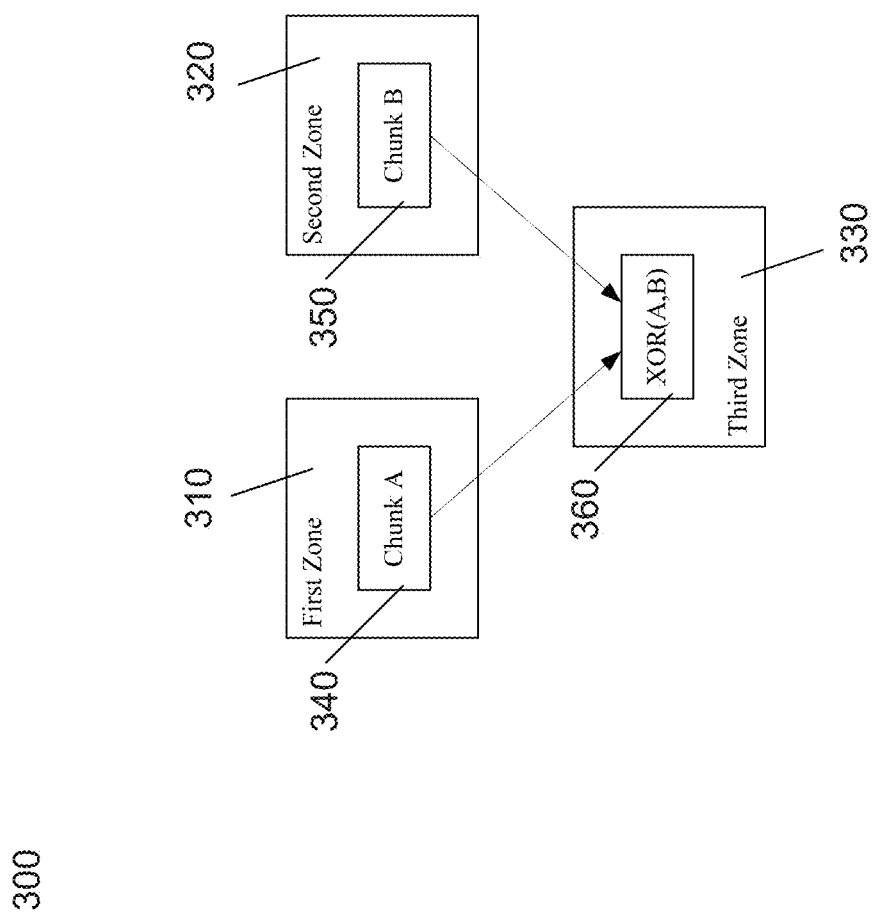
FIG. 3 is a block diagram illustrating an example implementation of the XOR technique.

Referring to FIG. 3, a block diagram 300 illustrating an example implementation of the XOR technique is shown.

The XOR technique can be used for geo-replication setups consisting of three or more zones. In FIG. 3, there are three zones: a first zone 310, a second zone 320, and a third zone 330. The first zone 310 replicates Chunk A 340 to the third zone 330. The second zone 320 replicates Chunk B 350 to the third zone 330 as well. The third zone 330 does not store two chunk copies for Chunk A 340 and Chunk B 350. Instead, only one chunk worth of data is stored. Content of this chunk is the result of a bitwise XOR (exclusive or) operation on Chunk A 340 content and Chunk B 350 content. The chunk stored at the third zone 330 may be referred to as a Chunk X 360. Therefore, Chunk X=XOR(Chunk A, Chunk B).

When a chunk with user data, e.g. Chunk A 340 or Chunk B 350, becomes unreadable, the corresponding XOR chunk (e.g., Chunk X 360) can be used to restore its content. This mechanism may be referred to hereinafter as remote replication recovery. A chunk is unreadable when it is completely missing or some its fragments are missing and the number of remaining fragments (n) is not enough for decoding (n<k) using the erasure code. Chunk loss may result from unavoidable hardware failures (disks and nodes) and/or data corruption. In some cases, a large number of chunks may become unreadable.

A person skilled in the art would realize that remote replication recovery can be represented with a simple formula: Chunk A=XOR (Chunk X, Chunk B) (when Chunk A 340 is to be recovered), or Chunk B=XOR (Chunk A, Chunk X) (when Chunk B 350 is to be recovered).

It should be noted that different sites/zones/clusters united to one cloud may use different erasure coding schemes. For example, it is possible that the first zone 310 uses a 12+4 scheme; the second zone 320 uses a 4+2 scheme; and a third zone 330 uses a 10+2 scheme (e.g., Amazon's Glacier cloud storage offering).

The conventional implementation of remote replication recovery may be slow. It involves three geographically distributed zones and there are manipulations over three chunks of a 128 MBs size each. If the network connection (e.g., a wide-area network "WAN" connection) between the zones does not have sufficient bandwidth, which is unfortunately a frequent condition, and there are a large number of unreadable chunks, the complete remote replication recovery can take a long time.

Embodiments of the disclosure are based on the observation that to recover a chunk with remote replication recovery, there is no need to recover the entire chunk content. It is enough to recover some missing/corrupt chunk fragments only. Recovery of a smaller piece of data means higher efficiency and shorter recovery duration.

Figure 4:
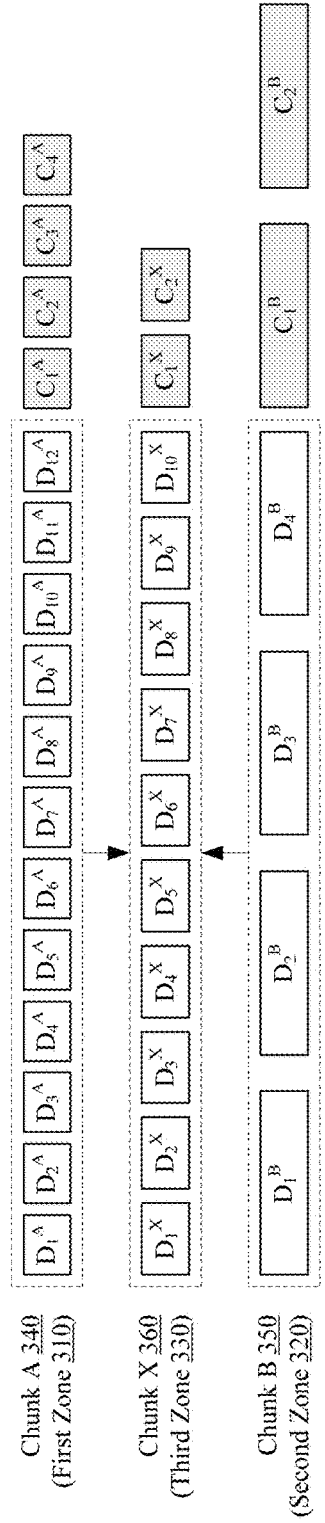
FIG. 4 is a diagram illustrating an example environment in which embodiments of the disclosure may be practiced.

Referring to FIG. 4, a diagram illustrating an example environment 400 in which embodiments of the disclosure may be practiced is shown. It should be noted that the zones (including the first zone 310, the second zone 320, and the third zone 330) use different erasure coding schemes. Chunk A 340 is stored in the first zone 310 as a set of 12 data fragments $D_1^A$-$D_{12}^A$ and 4 coding fragments $C_1^A$-$C_4^A$. Chunk B 350 is stored in the second zone 320 as a set of 4 data fragments $D_1^B$-$D_4^B$ and 2 coding fragments $C_1^B$-$C_2^B$. Chunk X 360 (e.g., XOR chunk) is stored in the third zone 330 for Chunk A and Chunk B. The content of Chunk X can be represented as a set of 10 data fragments $D_1^X$-$D_{10}^X$ and 2 coding fragments $C_1^X$-$C_2^X$.

Figure 5:
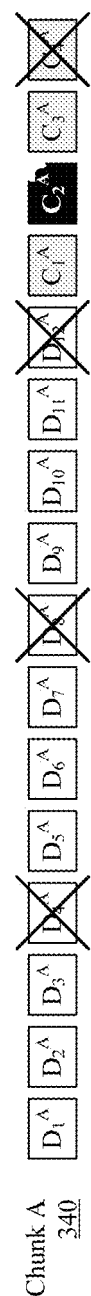
FIG. 5 a diagram illustrating an example scenario in which Chunk A becomes unreadable.

Referring to FIG. 5, a diagram 500 illustrating an example scenario in which Chunk A 340 becomes unreadable. In this example, after a node failure in the first zone 310, Chunk A 340 has lost three data fragments $D_4^A$, $D_8^A$, and $D_{12}^A$ and one coding fragment $C_4^A$ and has a corrupt coding fragment $C_2^A$. Zone-local (i.e., intra-zone) erasure coding-based recovery fails because the chunk has only 11 valid data and coding fragments, while 12 (k) fragments are required for decoding. Therefore, Chunk A cannot be recovered locally using erasure coding only.

Remote replication recovery may be triggered for Chunk A 340. Conventionally, the recovery works as follows: 1) The first zone 310 sends a recovery request for Chunk A 340 to the third zone 330; 2) A recovery node in the third zone 330 that drives the recovery reads Chunk B 350 from the second zone 320; 3) The recovery node reads Chunk X 360 from zone-local nodes; 4) The recovery node derives content of Chunk A 340 using the formula below: Chunk A=XOR (Chunk X, Chunk B); 5) The third zone 330 sends the restored content of Chunk A 340 to the first zone 310; 6) The first zone 310 protects the received Chunk A 340 with erasure coding (e.g., generate data and coding fragments); and 7) The first zone 310 deletes the damaged version of Chunk A 349.

Thus, conventional remote replication recovery may require the following data traffic between the zones across a WAN connection: the entire Chunk B 350 (e.g., 128 MBs) between the second zone 320 and the third zone 330, and the entire Chunk A 340 (e.g., 128 MBs) between the third zone 330 and the first zone 310. There is also overhead associated with the XOR operation at the chunk level: zone-local read of the entire Chunk X 360 (e.g., 128 MBs) and the XOR operation between Chunk B 350 and Chunk X 360.

According to the embodiments of the disclosure, remote replication recovery may be performed at the data fragment level instead of the chunk level. When the damaged chunk still has valid data fragments, performing remote replication recovery at the data fragment level may reduce the amount of data that needs to be read, transmitted across WAN connections and processed.

In one embodiment, remote replication recovery may be performed for all missing/corrupt data fragments only. In the example illustrated in FIG. 5, recovery is needed only for the data fragments $D_4^A$, $D_8^A$, and $D_{12}^A$. The procedure may work as follows: 1) The first zone 310 sends to the third zone 330 a recovery request for the data sub-portions that correspond to the fragments $D_4^A$, $D_8^A$, and $D_{12}^A$; 2) A recovery node in the third zone 330 that drives the recovery reads the corresponding data sub-portions of Chunk B 350 from the second zone 320; 3) The recovery node reads the corresponding data sub-portions of Chunk X 360 from zone-local nodes; 4) The recovery node derives content of the data fragments $D_4^A$, $D_8^A$, and $D_{12}^A$ using the formulas below: $D_4^A$=XOR($D_4^{B'}$, $D_4^{X'}$), $D_8^A$=XOR($D_8^{B'}$, $D_8^{X'}$), and $D_{12}^A$=XOR($D_{12}^{B'}$, $D_{12}^{X'}$), where $D_4^{B'}$, $D_8^{B'}$, and $D_{12}^{B'}$ are corresponding data sub-portions of Chunk B 350, and $D_4^{X'}$, $D_8^{X'}$, and $D_{12}^{X'}$ are corresponding data sub-portions of Chunk X 360; 5) The third zone 330 sends content of the data fragments $D_4^A$, $D_8^A$, and $D_{12}^A$ to the first zone 310; 6) The first zone 310 repairs Chunk A 340 with the received fragments $D_4^A$, $D_8^A$, and $D_{12}^A$ and protects the repaired Chunk A 340 with erasure coding (e.g., regenerate coding fragments if necessary); and 7) The first zone 310 deletes the damaged data fragments (and the damaged coding fragments, if necessary). It should be appreciated that two data sub-portions correspond to each other when they have the same size and are located at the same relative location in their respective chunk.

Because different zones may use different erasure coding schemes, the data sub-portions used in remote replication recovery described above may be identified by offset and size (or start offset and end offset), instead of the data fragment identifier. For example, for the first zone 310 (i.e., 12 data fragments), the data sub-portion for $D_4^A$ can be identified as: <Offset: chunk_size/12*3, Size: chunk_size/12> (or <Start Offset: chunk_size/12*3, End Offset: chunk_size/12*4−1>). In case two or more adjacent data fragments require recovery, they can be united into one data sub-portion.

Therefore, this embodiment allows reduction of data traffic between zones. Also it reduces load on the third zone 330. It needs to read and process less data compared to the conventional implementation. In the example illustrated in FIG. 5, the amount of data to transfer between the zones and to handle on the third zone 330 is four times less than with the conventional implementation at the chunk level. Indeed, according to this embodiment, only 3 data fragments out of 12 need to be recovered through remote replication recovery.

In another embodiment, remote replication recovery may be performed only up to the number of data fragments that would allow the zone with the damaged chunk to recover the remaining invalid data fragments locally with erasure coding. In other words, only (k−n) data fragments may be recovered with remote replication recovery, where k (e.g., 12) is the number of data fragments per chunk and n is the number of readable data and coding fragments. According to this embodiment, content of a chunk may be recovered in two steps: 1) remote replication recovery of some (k−n) missing/corrupt data fragments; and 2) local recovery of the rest missing/corrupt data fragments (and invalid coding fragments, if any) via decoding operation based on erasure coding.

The benefit from the two step recovery described above is further reduction of data traffic between zones and processing overhead at remote zones. The benefit of further reduced amount of data transfer may be especially appreciated in the field where the network bandwidth between truly geographically distributed zones is often an issue (e.g., the "notorious" trio New York, London, and Tokyo).

In the example illustrated in FIG. 5, which is quite realistic, remote replication recovery may be done for one data fragment only. Indeed, the number of data and coding fragments needed to recover Chunk A locally is 12. Since 11 fragments including 9 data fragments and 2 coding fragments are available, one additional valid data fragment would allow full local recovery via erasure coding. Therefore, the amount of data to transfer between the zones and to handle at the third zone 330 is twelve times less than with the conventional implementation at the chunk level. The traffic is three times less than with the embodiment described above where all missing/damaged data fragments are recovered via remote replication recovery.

A person skilled in the art should realize that the decoding operation in the embodiment described above where the data chunk is recovered with a two-step process does not add much overhead to the zone requiring chunk recovery compared to other implementations of the chunk recovery process, because in the vast majority of cases, encoding is needed after complete remote replication recovery of chunk data, and encoding and decoding are identical operations from the resource consumption point of view.

Figure 6:
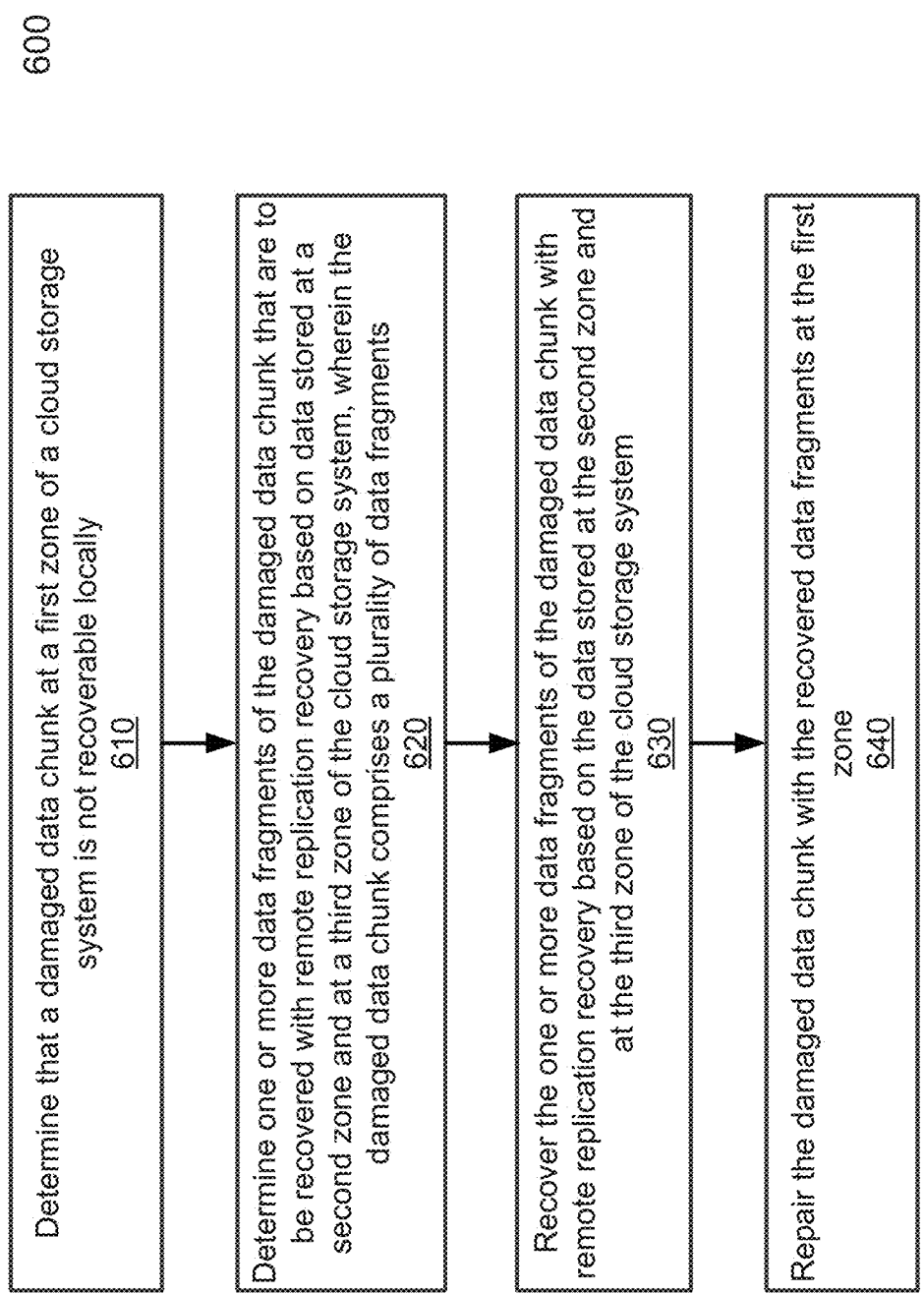
FIG. 6 is a flowchart illustrating an example method for remote replication recovery.

Referring to FIG. 6, a flowchart illustrating an example method 600 for remote replication recovery is shown. At block 610, it may be determined that a damaged data chunk at a first zone of a cloud storage system is not recoverable locally. Determining that the damaged data chunk at the first zone of the cloud storage system is not recoverable locally may further comprise determining that the damaged data chunk is not recoverable using erasure coding based on data stored within the first zone. At block 620, one or more data fragments of the damaged data chunk that are to be recovered with remote replication recovery based on data stored at a second zone and at a third zone of the cloud storage system may be determined. The first, second, and third zones may be geographically distributed, e.g., on different continents. In one embodiment, the one or more data fragments that are to be recovered with remote replication recovery may be all of invalid data fragments of the damaged data chunk; in another embodiment, the one or more data fragments that are to be recovered with remote replication recovery may be determined so that the remaining invalid data fragments not recovered with remote replication recovery are recoverable locally at the first zone with erasure coding. At block 630, the one or more data fragments of the damaged data chunk may be recovered with remote replication recovery based on data stored at the second zone and at the third zone of the cloud storage system. Recovering the one or more data fragments of the damaged data chunk with remote replication recovery may further comprise performing a bitwise exclusive or (XOR) operation on at least part of the data stored at the second zone and at the third zone of the cloud storage system. When not all of invalid data fragments of the damaged data chunk are recovered with remote replication recovery, the remaining invalid data fragments of the damaged data chunk may be recovered locally at the first zone with erasure coding. At block 640, the damaged data chunk may be repaired with the recovered data fragments. Further, the repaired data chunk may be protected with erasure coding at the first zone.

Method 600 may be performed by processing logic that includes hardware (e.g. circuitry, dedicated logic, etc.), software (e.g., embodied on a non-transitory computer readable medium), or a combination thereof. For example, method 600 may be performed by processors 1501 of FIG. 7. Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Therefore, according to the embodiments of the disclosure herein, in a cloud storage system, remote replication recovery may be performed on the data fragment level instead of the conventional chunk level. In one embodiment, all and only invalid data fragments are recovered with remote replication recovery. In another embodiment, only sufficient number of invalid data fragments are recovered with remote replication recovery so that the remaining invalid data fragments may be recovered locally with erasure coding. As long as there is at least one valid data or coding fragment remaining in the damaged data chunk, the amount of data that needs to be transmitted across WAN connections and the amount of processing can both be reduced. Thus, embodiments of the disclosure are related to faster healing for systems that recover after hardware failure and/or data corruption.

Figure 7:
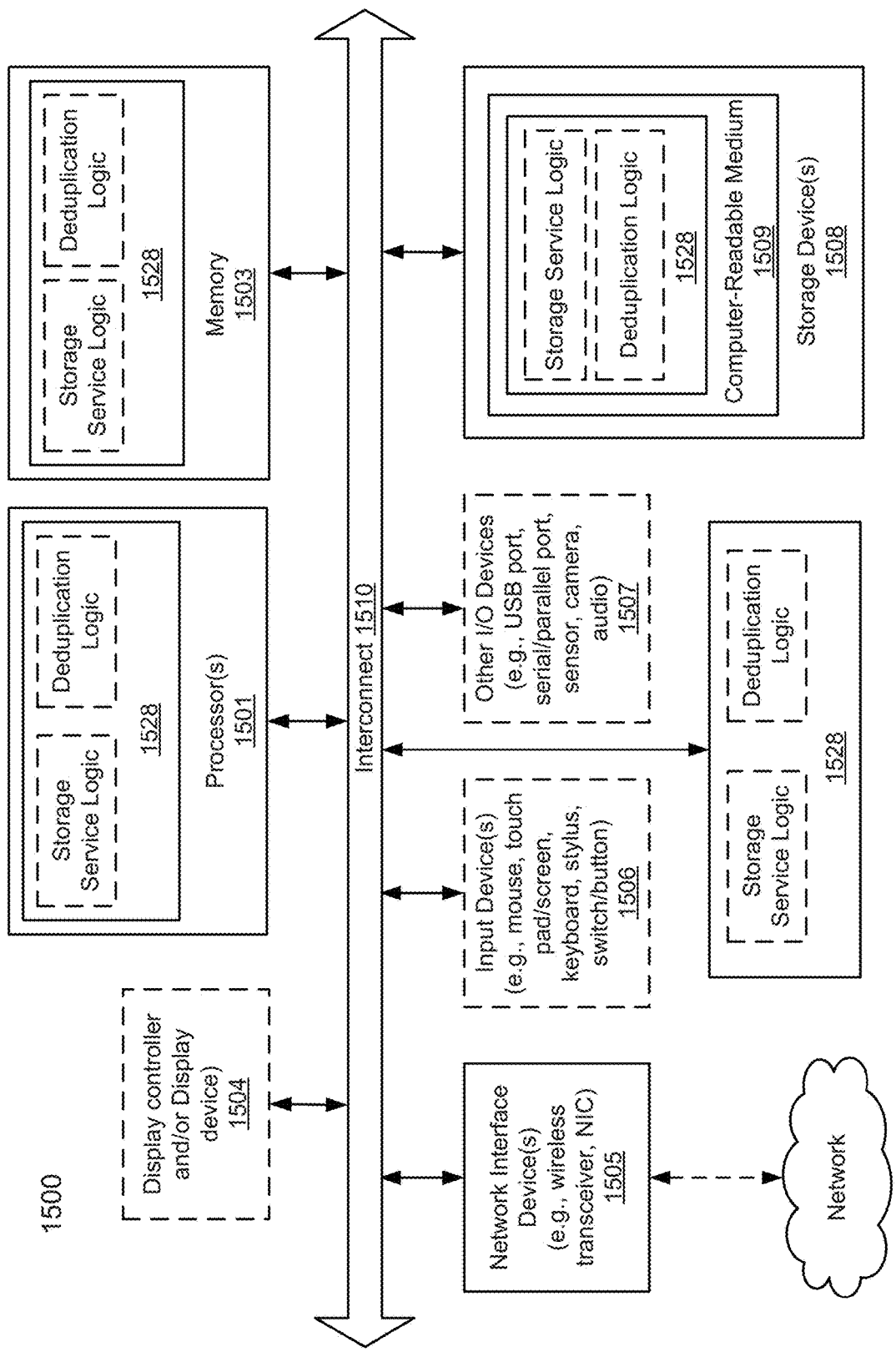
FIG. 7 is a block diagram illustrating an example of a data processing system which may be used with one embodiment of the disclosure.

FIG. 7 is a block diagram illustrating an example of a data processing system 1500 which may be used with one embodiment of the disclosure. For example, system 1500 may represents any of data processing systems described above performing any of the processes or methods described above. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including a basic input/output software (BIOS) as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Module/unit/logic 1528 may also reside, completely or at least partially, within memory 1503 and/or within processor 1501 during execution thereof by data processing system 1500, memory 1503 and processor 1501 also constituting machine-accessible storage media. Module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Module/unit/logic 1528, components and other features described herein can be implemented as discrete hardware components or integrated in the functionality of hardware components such as ASICS, FPGAs, DSPs or similar devices. In addition, module/unit/logic 1528 can be implemented as firmware or functional circuitry within hardware devices. Further, module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for remote replication recovery, comprising:
    determining that a damaged data chunk at a first zone of a cloud storage system is not recoverable locally, wherein each data chunk corresponds to storage space of a predetermined fixed size and comprises a plurality of data fragments that are protected with one or more coding fragments generated based on erasure coding;
    determining one or more data fragments of the damaged data chunk that are to be recovered with remote replication recovery based on data stored at a second zone and at a third zone of the cloud storage system;
    recovering the one or more data fragments of the damaged data chunk with remote replication recovery based on the data stored at the second zone and at the third zone of the cloud storage system, wherein during the remote replication recovery the data fragments to be recovered are each identified within the respective data chunk with a fragment offset and a fragment size; and
    subsequent to recovering the one or more data fragments of the damaged data chunk, repairing the damaged data chunk with the recovered data fragments at the first zone.

2. The method of claim 1, wherein determining that the damaged data chunk at the first zone of the cloud storage system is not recoverable locally further comprises determining that the damaged data chunk is not recoverable using erasure coding based on data stored within the first zone.

3. The method of claim 1, wherein the first, second, and third zones are geographically distributed.

4. The method of claim 1, wherein the one or more data fragments that are to be recovered with remote replication recovery comprise all of invalid data fragments of the damaged data chunk.

5. The method of claim 1, wherein the one or more data fragments that are to be recovered with remote replication recovery are determined so that remaining invalid data fragments not recovered with remote replication recovery are recoverable locally at the first zone with erasure coding.

6. The method of claim 5, further comprising recovering the remaining invalid data fragments of the damaged data chunk locally at the first zone with erasure coding.

7. The method of claim 1, wherein recovering the one or more data fragments of the damaged data chunk with remote replication recovery further comprises performing a bitwise exclusive or (XOR) operation on at least part of the data stored at the second zone and at the third zone of the cloud storage system.

8. The method of claim 1, further comprising protecting the repaired data chunk with erasure coding at the first zone.

9. A non-transitory machine-readable medium having instructions stored therein which, when executed by a processor, cause the processor to perform testing operations, the operations comprising:
determining that a damaged data chunk at a first zone of a cloud storage system is not recoverable locally, wherein each data chunk corresponds to storage space of a predetermined fixed size and comprises a plurality of data fragments that are protected with one or more coding fragments generated based on erasure coding;
determining one or more data fragments of the damaged data chunk that are to be recovered with remote replication recovery based on data stored at a second zone and at a third zone of the cloud storage system;
recovering the one or more data fragments of the damaged data chunk with remote replication recovery based on the data stored at the second zone and at the third zone of the cloud storage system, wherein during the remote replication recovery the data fragments to be recovered are each identified within the respective data chunk with a fragment offset and a fragment size; and
subsequent to recovering the one or more data fragments of the damaged data chunk, repairing the damaged data chunk with the recovered data fragments at the first zone.

10. The non-transitory machine-readable medium of claim 9, wherein determining that the damaged data chunk at the first zone of the cloud storage system is not recoverable locally further comprises determining that the damaged data chunk is not recoverable using erasure coding based on data stored within the first zone.

11. The non-transitory machine-readable medium of claim 9, wherein the first, second, and third zones are geographically distributed.

12. The non-transitory machine-readable medium of claim 9, wherein the one or more data fragments that are to be recovered with remote replication recovery comprise all of invalid data fragments of the damaged data chunk.

13. The non-transitory machine-readable medium of claim 9, wherein the one or more data fragments that are to be recovered with remote replication recovery are determined so that remaining invalid data fragments not recovered with remote replication recovery are recoverable locally at the first zone with erasure coding.

14. The non-transitory machine-readable medium of claim 13, wherein the operations further comprise recovering the remaining invalid data fragments of the damaged data chunk locally at the first zone with erasure coding.

15. The non-transitory machine-readable medium of claim 9, wherein recovering the one or more data fragments of the damaged data chunk with remote replication recovery further comprises performing a bitwise exclusive or (XOR) operation on at least part of the data stored at the second zone and at the third zone of the cloud storage system.

16. The non-transitory machine-readable medium of claim 9, wherein the operations further comprise protecting the repaired data chunk with erasure coding at the first zone.

17. A data processing system, comprising:
a processor; and
a memory coupled to the processor storing instructions which, when executed by the processor, cause the processor to perform testing operations, the operations including
determining that a damaged data chunk at a first zone of a cloud storage system is not recoverable locally, wherein each data chunk corresponds to storage space of a predetermined fixed size and comprises a plurality of data fragments that are protected with one or more coding fragments generated based on erasure coding;
determining one or more data fragments of the damaged data chunk that are to be recovered with remote replication recovery based on data stored at a second zone and at a third zone of the cloud storage system;
recovering the one or more data fragments of the damaged data chunk with remote replication recovery based on the data stored at the second zone and at the third zone of the cloud storage system, wherein during the remote replication recovery the data fragments to be recovered are each identified within the respective data chunk with a fragment offset and a fragment size; and
subsequent to recovering the one or more data fragments of the damaged data chunk, repairing the damaged data chunk with the recovered data fragments at the first zone.

18. The data processing system of claim 17, wherein determining that the damaged data chunk at the first zone of the cloud storage system is not recoverable locally further comprises determining that the damaged data chunk is not recoverable using erasure coding based on data stored within the first zone.

19. The data processing system of claim 17, wherein the first, second, and third zones are geographically distributed.

20. The data processing system of claim 17, wherein the one or more data fragments that are to be recovered with remote replication recovery comprise all of invalid data fragments of the damaged data chunk.

21. The data processing system of claim 17, wherein the one or more data fragments that are to be recovered with remote replication recovery are determined so that remaining invalid data fragments not recovered with remote replication recovery are recoverable locally at the first zone with erasure coding.

22. The data processing system of claim 21, wherein the operations further comprise recovering the remaining invalid data fragments of the damaged data chunk locally at the first zone with erasure coding.

23. The data processing system of claim 17, wherein recovering the one or more data fragments of the damaged data chunk with remote replication recovery further comprises performing a bitwise exclusive or (XOR) operation on at least part of the data stored at the second zone and at the third zone of the cloud storage system.

24. The data processing system of claim 17, wherein the operations further comprise protecting the repaired data chunk with erasure coding at the first zone.

* * * * *